United States Patent
Manabe (10) Patent No.: US 9,190,434 B2
(45) Date of Patent: Nov. 17, 2015

(54) CMOS IMAGE SENSOR WITH RESET SHIELD LINE

(71) Applicant: OmniVision Technologies, Inc., Santa Clara, CA (US)

(72) Inventor: Sohei Manabe, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 54 days.

(21) Appl. No.: 13/858,833

(22) Filed: Apr. 8, 2013

(65) Prior Publication Data

US 2014/0299925 A1    Oct. 9, 2014

Related U.S. Application Data

(63) Continuation of application No. 13/251,036, filed on Sep. 30, 2011, now Pat. No. 8,461,660.

(51) Int. Cl.
*H01L 31/062* (2012.01)
*H01L 31/113* (2006.01)
*H01L 27/146* (2006.01)
*H04N 5/335* (2011.01)

(52) U.S. Cl.
CPC .... *H01L 27/14603* (2013.01); *H01L 27/14609* (2013.01); *H04N 5/335* (2013.01); *H01L 27/14636* (2013.01)

(58) Field of Classification Search
USPC ............... 257/292, 215, 290, 459, 758, 773, 257/E27.133, E27.132, 291, E31.073, 239, 257/E21.158, E21.334, E31.054, E31.084, 257/E31.11, 59, 57, 527, 60, 70; 438/59, 438/57, 527, 60, 70
See application file for complete search history.

(56) References Cited

U.S. PATENT DOCUMENTS

2006/0273353 A1\*  12/2006  Guidash et al. ............... 257/239
2010/0060764 A1\*  3/2010   McCarten et al. ............ 348/308

OTHER PUBLICATIONS

"Notice of Allowance for U.S. Appl. No. 13/251,036", (Feb. 13, 2013), Whole Document.
"Office Action for U.S. Appl. No. 13/251,036", (Oct. 11, 2012), Whole Document.

\* cited by examiner

*Primary Examiner* — Su C Kim
*Assistant Examiner* — Junaiden Mirsalahuddin
(74) *Attorney, Agent, or Firm* — Blakely Sokoloff Taylor & Zafman LLP (57) ABSTRACT

Techniques and mechanisms to improve potential well characteristics in a pixel cell. In an embodiment, a coupling portion of a pixel cell couples a reset transistor of the pixel cell to a floating diffusion node of the pixel cell, the reset transistor to reset a voltage of the floating diffusion node. In another embodiment, the pixel cell includes a shield line which extends athwart the coupling portion, where the shield line is to reduce a parasitic capacitance of the reset transistor to the floating diffusion node.

11 Claims, 9 Drawing Sheets

CMOS IMAGE SENSOR WITH RESET SHIELD LINE

RELATED APPLICATIONS

The present application is a Continuation of, and claims priority to and incorporates by reference, the corresponding U.S. patent application Ser. No. 13/251,036 filed Sep. 30, 2011, and entitled "CMOS IMAGE SENSOR WITH RESET SHIELD LINE."

BACKGROUND

1. Technical Field

This disclosure relates generally to image sensors, and in particular, but not exclusively to complementary metal-oxide semiconductor ("CMOS") image sensors.

2. Background Art

Image sensors have become ubiquitous. They are widely used in digital still cameras, cellular phones, security cameras, as well as, medical, automobile and other applications. The technology used to manufacture image sensors, and in particular complementary metal-oxide semiconductor ("CMOS") image sensor, has continued to advance at a great pace. For example, the demands of higher resolution and lower power consumption have encouraged the further miniaturization and integration of these image sensors.

Figure 1A:
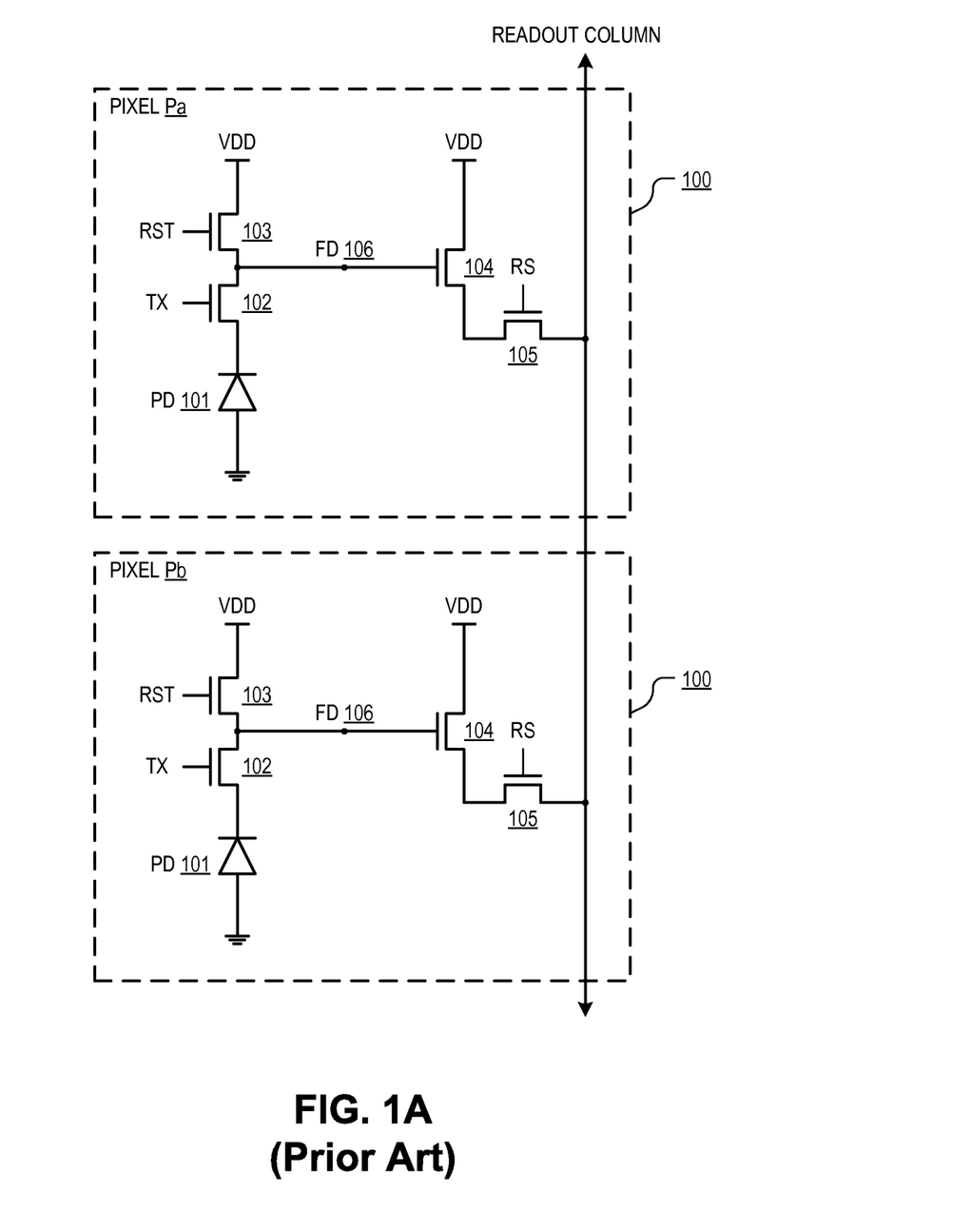
FIG. 1A is a circuit diagram illustrating pixel circuitry of two four-transistor ("4T") pixel cells within an image sensor array.

FIG. 1A is a circuit diagram illustrating pixel circuitry of two four-transistor ("4T") pixel cells Pa and Pb (collectively pixel cells 100) within a conventional image sensor array. Pixel cells Pa and Pb are arranged in two rows and one column and time share a single readout line. Each pixel 100 includes photodiode 101, transfer transistor 102, reset transistor 103, source-follower transistor 104 and row select transistor 105.

During operation, transfer transistor 102 receives transfer signal TX which transfers the charge accumulated in photodiode 101 to floating diffusion node 106. Reset transistor 103 is coupled between power rail VDD and floating diffusion node 106 to reset the pixel (e.g. discharge or charge floating diffusion node 106 and photodiode 101 to a preset voltage) under the control of reset signals RST. Floating diffusion node 106 is coupled to the gate terminal of source-follower transistor 104. Source-follower transistor 104 is coupled between power rail VDD and row select transistor 105. Source-follower transistor 104 operates as a source-follower, providing a high impedance connect to floating diffusion node 106. Row select transistor 105 selectively couples the output of pixel cell 100 to readout column line or bit line under the control of signal RS.

In normal operation, photodiode 101 and floating diffusion node 106 are reset during a reset phase by temporarily asserting reset signal RST and transfer signal TX. After the reset phase, the integration phase is commenced by de-asserting transfer signal TX and reset signal RST and permitting incident light to charge photodiode 101. The voltage or charge on photodiode 101 is indicative of the intensity of light incident of photodiode 101 during the integration phase. The readout phase is commenced before the end of the integration phase by asserting reset signal RST to reset floating diffusion node 106 to reset voltage RST. RST approximately equals power rail VDD minus the threshold voltage of reset transistor 103. After floating diffusion node 106 has been reset, row select signal RS and a sample signal are asserted, which couples floating diffusion node 106 to a sample and hold circuit (not shown). After the reset voltage is sampled, the sample signal is de-asserted. The end of the integration phase occurs after the de-assertion of the sample signal. Transfer signal TX is then asserted to couple photodiode 101 to floating diffusion node 106 and the gate terminal of source-follower transistor 104. As the accumulated electrons on photodiode 101 is transferred to floating diffusion node 106, the voltage at floating diffusion node 106 decrease since electrons are negative charge carriers. After charge transfer is complete, transfer signal TX is de-asserted. After transfer signal TX is de-asserted, sample signal RS is asserted and the voltage at floating diffusion node 106 is sampled.

When reset signal RST is asserted during the reset phase and the beginning of the readout phase, the channel region of reset transistor 103 is inverted and electrons are injected into the channel. When reset signal RST is de-asserted, some charges will be injected to the terminal coupled to power rail VDD and other charges will be injected to the terminal coupled to floating diffusion node 106.

The voltage potential well at floating diffusion node 106 after a pixel is reset strongly relates to the occurrence of image lag at a high signal level. Consequently, a decrease in the potential well of floating diffusion node 106 would decrease the voltage swing and the conversion gain of the pixel cell (and therefore the image sensor). The post-reset potential well at floating diffusion nodes tends to become shallower as successively smaller-sized pixels are developed. These shallow potential well characteristics pose a serious limitation on improving image sensor performance.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1B:
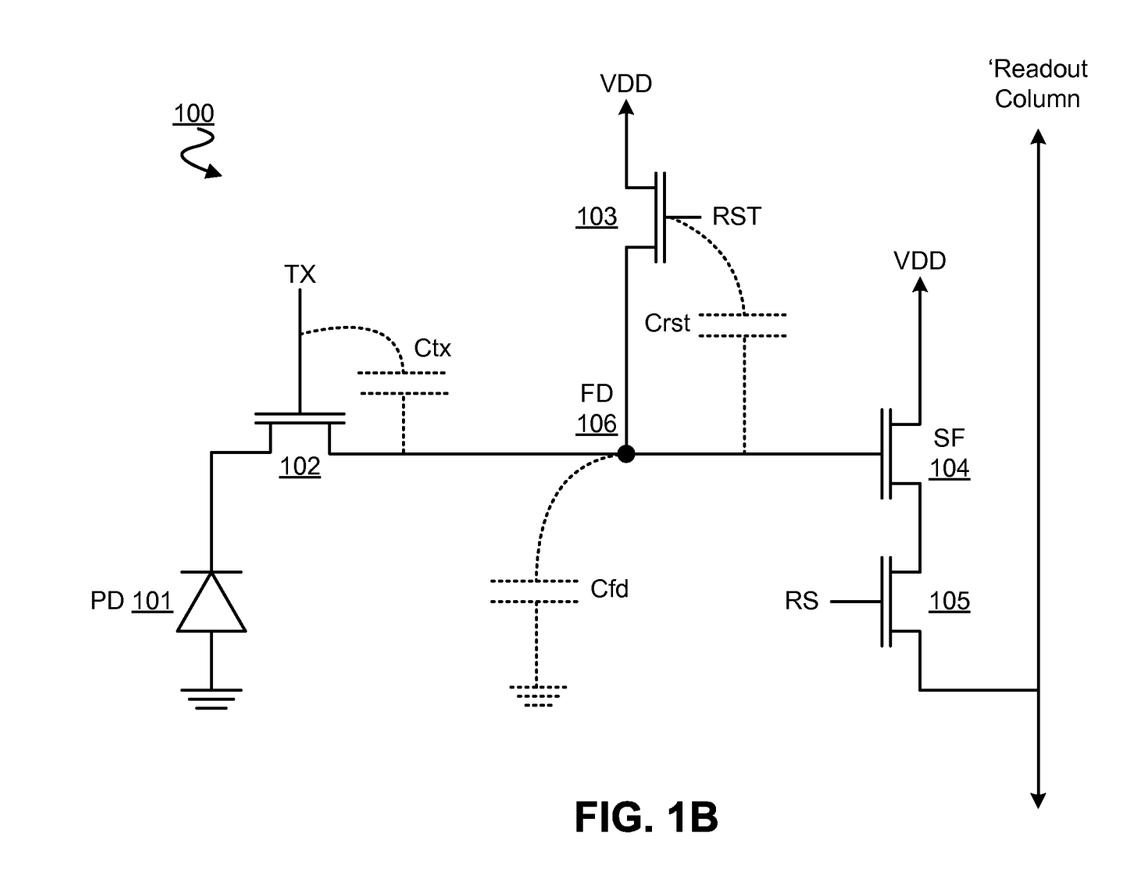
FIG. 1B is a circuit diagram illustrating physical properties of a 4T pixel cell in a conventional image sensor array.

FIG. 1B illustrates properties of pixel cell 100—e.g. in FIG. 1A—which affect image sensing performance in a conventional image sensor. More particularly, operation of pixel cell 100 may be affected by one or more of (1) a transfer capacitance (Ctx) between the gate of transfer transistor 102 and floating diffusion node 106, (2) a reset capacitance (Crst) between the gate of reset transistor 103 and floating diffusion node 106, and (3) a floating node capacitance (Cfd) between floating diffusion node 106 and ground.

After a pixel reset, the potential well at floating diffusion node 106 needs to be sufficiently low—e.g. as compared to the potential at photodiode 101—to avoid signal charge from photodiode 101 overflowing at floating diffusion node 106, causing some of the signal charge to flow back into photodiode 101. This unintended charge sharing tends to result in image lag.

Successive generations of smaller and smaller pixel structures tend to exhibit less and less floating node capacitance Cfd, which by itself, contributes to signal sensitivity at floating diffusion node 106. However, as pixel size decreases, the ratio of the reset capacitance Crst to the floating node capacitance Cfd tends to increase. This increased capacitive ratio affects post-reset floating diffusion node potential. Due to charge injection when the reset transistor turns off, floating diffusion node potential is generally shallower by an amount generally proportional to [Vreset×(Crst/Cfd)].

Embodiments variously address this problem by providing a shield line—referred to herein as a reset shield line—which extends athwart a coupling portion between a reset device of a pixel cell and a floating diffusion node area. The location of a shield line between a reset transistor, for example, and a floating diffusion node portion of a pixel cell circuit may provide for reduced reset capacitance Crst. Due to the reduction in Crst, floating node capacitance Cfd may have a relatively larger affect on voltage potential changes which are to take place at the floating diffusion node 106. For example, floating node capacitance Cfd may more effectively limit charge injection from the reset transistor into the floating diffusion node. Consequently, the potential well of the floating diffusion node may remain comparatively deep, which may result, for example, in reduced image lag at a high signal level.

A reset shield line may be coupled to a gate of a transfer transistor of the pixel cell. In an embodiment, a reset shield line may operate as a floating node boost line—e.g. where shielding characteristics of the shield line are improved by a boost signal being carried in the reset shield line. In certain embodiments, the reset shield line is coupled to a bit readout line—e.g. a readout column line or a readout row line for reading an output of the pixel cell. One or ordinary skill in the art would understand from the discussion herein that other couplings of a reset shield line may be implemented, according to different embodiments.

Figure 2A:
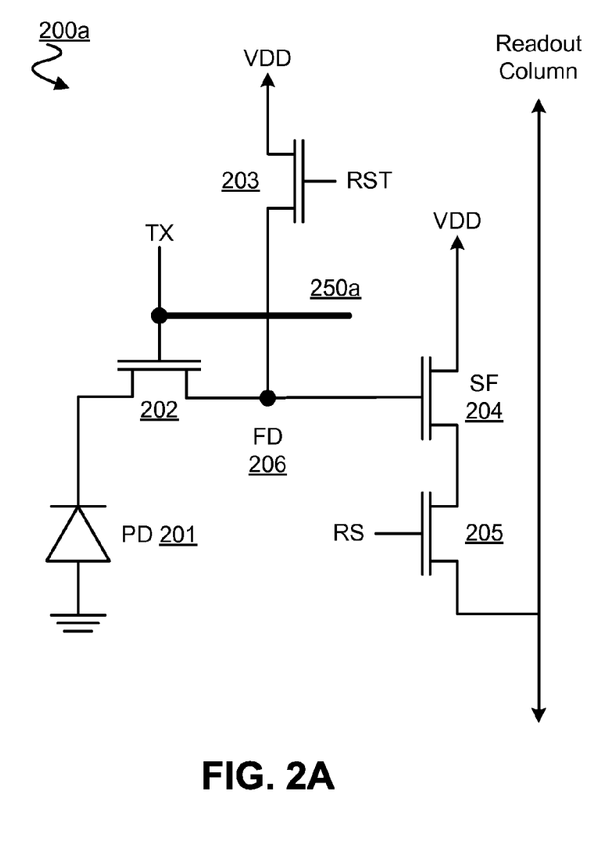
FIGS. 2A-2D are circuit diagrams illustrating pixel circuitry of respective pixel cells according to different embodiments.

FIG. 2A illustrates certain pixel circuit elements in pixel cell 200a according to an embodiment. Certain reset shielding features of various embodiments are discussed herein in terms of a 4T pixel cell. However, such discussion may be extended to apply to any of a variety of additional or alternative types of pixel cells—e.g. a 3T pixel cell, 5T pixel cell and/or the like.

Pixel 200a may include, for example, photodiode 201, transfer transistor 202, reset transistor 203, source-follower transistor 204 and row select transistor 205. Pixel 200a may include any of a variety of additional or alternative pixel circuit elements for converting an image into a data signal, according to different embodiments.

During operation, transfer transistor 202 may receive a transfer signal TX which transfers the charge accumulated in photodiode 201 to floating diffusion node 206. Reset transistor 203 may be coupled between power rail VDD and floating diffusion node 206 to reset the pixel (e.g. to discharge or charge floating diffusion node 206 and photodiode 201 to a preset voltage) under the control of reset signals RST. Floating diffusion node 206 may be coupled to a gate terminal of source-follower transistor 204. Source-follower transistor 204 may be coupled between power rail VDD and row select transistor 205. Source-follower transistor 204 may operate as a source-follower, providing a high impedance connect to floating diffusion node 206. Row select transistor 205 may selectively couple the output of pixel cell 200 to readout column line or bit line under the control of signal RS.

In normal operation, photodiode 201 and floating diffusion node 206 may be reset during a reset phase—e.g. by temporarily asserting reset signal RST and transfer signal TX. After the reset phase, the integration phase may be commenced—for example, by de-asserting transfer signal TX and reset signal RST and by permitting incident light to charge photodiode 201. A resulting voltage and/or charge on photodiode 201 may be indicative of the intensity of light incident of photodiode 201 during the integration phase. The readout phase may be commenced before the end of the integration phase—e.g. by asserting reset signal RST to reset floating diffusion node 206 to reset voltage RST. RST may approximately equal power rail VDD minus the threshold voltage of reset transistor 203. After floating diffusion node 206 has been reset, row select signal RS and a sample signal may be asserted, which couples floating diffusion node 206 to a sample and hold circuit (not shown). After the reset voltage is sampled, the sample signal may be de-asserted. The end of the integration phase may occur after the de-assertion of the sample signal. Transfer signal TX may then be asserted to couple photodiode 201 to floating diffusion node 206 and the gate terminal of source-follower transistor 204. As the accumulated electrons on photodiode 201 are transferred to floating diffusion node 206, the voltage at floating diffusion node 206 may decrease since electrons are negative charge carriers. After charge transfer is complete, transfer signal TX may be de-asserted. After transfer signal TX is de-asserted, sample signal RS may be asserted and the voltage at floating diffusion node 206 may be sampled.

To reduce reset capacitance Crst between reset transistor 203 and floating diffusion node 206, certain embodiments include in pixel cell 200a shield line 250a, a portion of which at least partially extends athwart—e.g. extends across and adjacent to—a connection between reset transistor 203 to floating diffusion node 206.

For example, floating diffusion node 206 may reside at or adjacent to, or include, a junction in pixel cell 200a where transfer transistor 202, reset transistor 203 and source-follower transistor 204 couple to one another. Accordingly, some or all of the respective terminals of transfer transistor 202, reset transistor 203 and source-follower transistor 204 may be offset from such a junction—e.g. where a trace line or other conductive portion of pixel cell 200a spans the offset to form a connection between reset transistor 203 and floating diffusion node 206.

Some portion of shield line 250a may extend athwart a portion of pixel cell 200a which connects the junction forming at least part of floating diffusion node 206 and a terminal which, of the terminals of reset transistor 203, is most directly coupled to floating diffusion node 206. By way of illustration, a portion of shield line 250a which is closest to the connection between floating diffusion node 206 and the most directly coupled terminal of reset transistor 203 may extend in a direction which is not parallel to the direction in which that connection extends. In an embodiment, a reset shield line such as shield line 250 may be comprised of one or more components—e.g. one or more metal or otherwise conductive shielding elements.

As shown in pixel cell 200a, shield line 250a may, for example couple at one end to a gate of transfer gate 202. However, certain embodiments are not limited in this regard, and shield line 250a may be coupled to any of a variety of additional or alternative circuit elements, according to various embodiments. In an embodiment, the other end of shield line 250a may remain unconnected—e.g. at least to any of the other circuit elements of pixel cell 200a shown in FIG. 2A.

The dimensions of a given shield line—e.g. the width and/or thickness thereof—may be determined by the layout of other structures of the pixel cell, by minimum design rules of the chosen shield metal, and/or the like. By way of illustration and not limitation, a shield line—e.g. shield line 250a or various others discussed herein—may have a width on the order of 0.14 µm and/or a thickness on the order of 0.14 µm. However, such a shield line may have any of a variety of alternative dimension values according to different embodiments—e.g. as determined by implementation-specific constraints. The inclusion of a shield line as variously discussed herein may reduce a reset capacitance Crst to less than 0.1 femtofarads (fF), although certain embodiments are not limited in this regard.

Shield line 250a may provide a particular advantage in being connected to a gate of transfer transistor 202 and providing a coupling capacitance to floating diffusion node 206. Due to such a configuration, the coupling capacitance provided by shield line 250a may cause floating diffusion node 206 to transition to a comparatively deeper voltage potential when the gate of transfer transistor 202 turns on. A deeper potential at floating diffusion node 206 is very favorable for signal readout from the photodiode to FD.

Figure 2B:
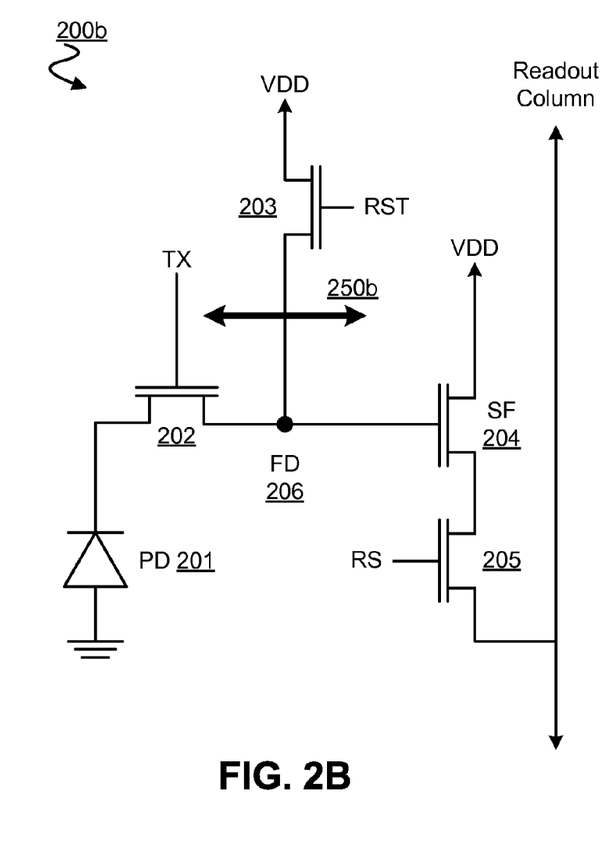

FIG. 2B illustrates certain pixel circuit elements in pixel cell 200b according to an embodiment. To avoid obscuring features of certain embodiments, pixel cell 200b is shown as including a 4T pixel circuit arrangement similar to that of pixel cell 200a. More particularly, pixel 200b is show as including the illustrative photodiode 201, transfer transistor 202, reset transistor 203, source-follower transistor 204 and row select transistor 205 for operation similar to that described with respect to pixel cell 200a. However, the respective shielding techniques of pixel cells 200a, 200b may each be variously applied to one or more additional or alternative pixel circuit architectures, according to various embodiments.

To reduce reset capacitance Crst between reset transistor 203 and floating diffusion node 206, certain embodiments include in pixel cell 200b shield line 250b, a portion of which at least partially extends athwart—e.g. extends across and adjacent to—a connection between reset transistor 203 to floating diffusion node 206. For example, shield line 250b may extend over the portion of pixel cell 200b which connects a junction forming at least part of floating diffusion node 206 and a terminal which, of the terminals of reset transistor 203, is most directly coupled to floating diffusion node 206.

In an embodiment, shield line 250b is not coupled—e.g. at least not directly coupled—to any of the other circuit elements of pixel cell 200b shown in FIG. 2B. By way of illustration and not limitation, shield line 250b may serve as a floating diffusion boost line. For example, one or more termini of shield line 250b may couple to a signal source (not shown) for providing a boost signal to be carried in shield line 250b.

Shield line 250b may reduce Crst in a manner which is at least slightly different from the capacitance reduction provided by shield line 250b. In an embodiment, shield line 250b carries a boost signal current which is isolated from other signals carried in the elements shown in FIG. 2B. So, for example, shield line 250b may be turned on after the reset signal RST is de-asserted. The potential of floating diffusion node 206 may be deeper as a result—e.g. due to the coupling capacitance which shield line 250b provides to floating diffusion node 206. In such an illustrative case, the potential at floating diffusion node 206 can to at least some extent be controlled independently by a boost signal in shield line 250b.

Figure 2C:
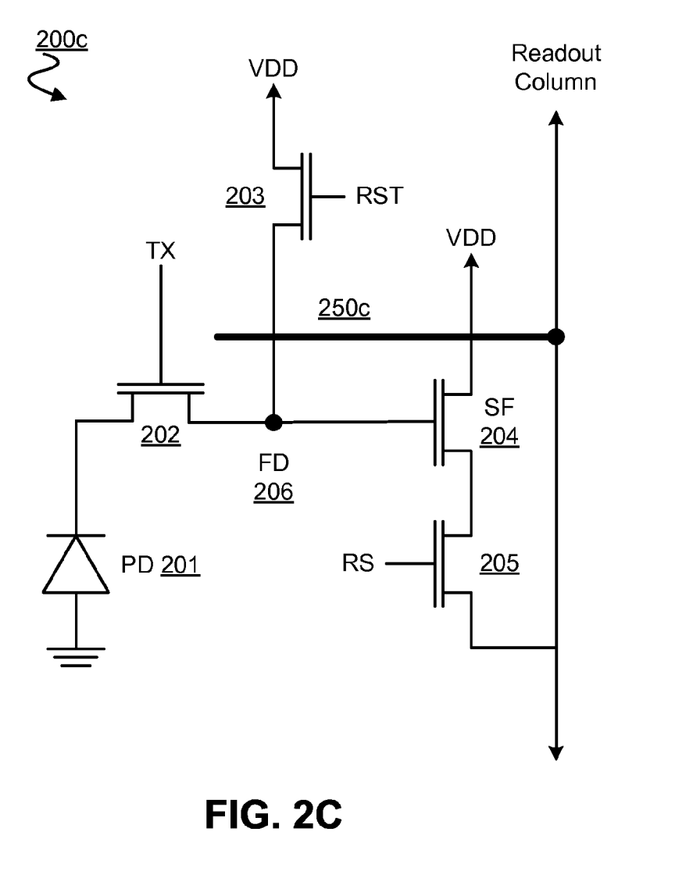

FIG. 2C illustrates certain pixel circuit elements in pixel cell 200c according to an embodiment. To avoid obscuring features of certain embodiments, pixel cell 200c is shown as including a 4T pixel circuit arrangement similar to that of pixel cell 200a. More particularly, pixel 200c is show as including the illustrative photodiode 201, transfer transistor 202, reset transistor 203, source-follower transistor 204 and row select transistor 205 for operation similar to that described with respect to pixel cell 200a. However, the respective shielding techniques of pixel cells 200a, 200b and 200c may each be variously applied to one or more additional or alternative pixel circuit architectures, according to various embodiments.

To reduce reset capacitance Crst between reset transistor 203 and floating diffusion node 206, certain embodiments include in pixel cell 200c shield line 250c, a portion of which at least partially extends athwart—e.g. extends across and adjacent to—a connection between reset transistor 203 to floating diffusion node 206. For example, shield line 250c may extend over the portion of pixel cell 200c which connects a junction forming at least part of floating diffusion node 206 and a terminal which, of the terminals of reset transistor 203, is most directly coupled to floating diffusion node 206.

Shield line 250c may, for example, couple at one end to a data readout line—e.g. a readout column, a readout row column and/or the like—which is to carry an output signal of pixel cell 200c. In an embodiment, another end of shield line 250c may remain unconnected—e.g. at least to any of the other circuit elements of pixel cell 200c shown in FIG. 2C. While providing a decrease in Crst, shield line 250c may—e.g. as compared to shield lines 250a, 250b—have small effective coupling capacitance to floating diffusion node 206. Consequently, due to source follower circuit characteristics, shield line 250c may provide a relatively smaller impact on floating diffusion potential.

Figure 2D:
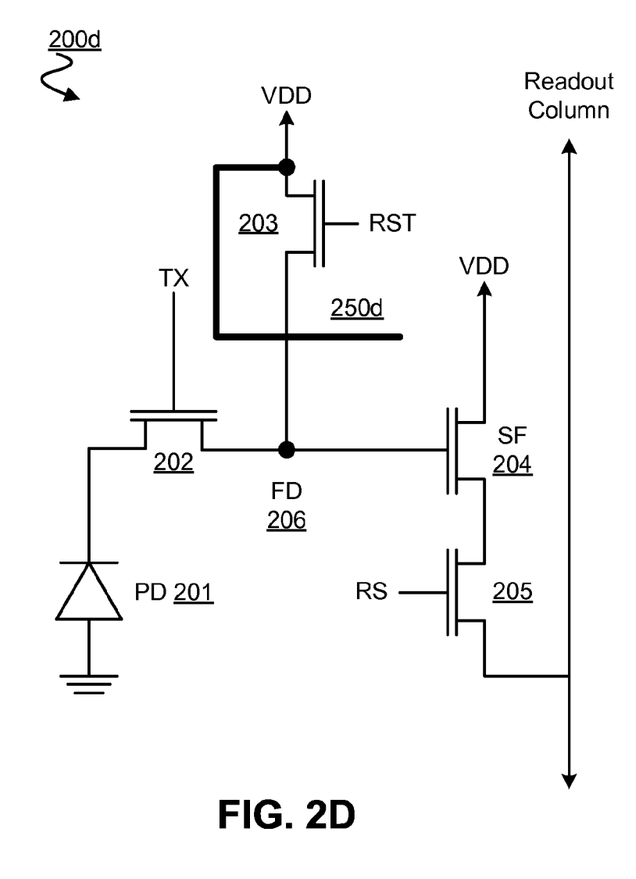

FIG. 2D illustrates certain pixel circuit elements in pixel cell 200d according to an embodiment. To avoid obscuring features of certain embodiments, pixel cell 200d is shown as including a 4T pixel circuit arrangement similar to that of pixel cell 200a. More particularly, pixel 200d is show as including the illustrative photodiode 201, transfer transistor 202, reset transistor 203, source-follower transistor 204 and row select transistor 205 for operation similar to that described with respect to pixel cell 200a. However, the respective shielding techniques of pixel cells 200a, 200b, 200c and 200d may each be variously applied to one or more additional or alternative pixel circuit architectures, according to various embodiments.

To reduce reset capacitance Crst between reset transistor 203 and floating diffusion node 206, certain embodiments include in pixel cell 200d shield line 250d, a portion of which at least partially extends athwart—e.g. extends across and adjacent to—a connection between reset transistor 203 to floating diffusion node 206. In an embodiment, shield line 250d couples at one end to a terminal of reset transistor 203 which, for example, is to draw current into reset transistor 203 from a supply voltage VDD during operation of the reset transistor 203. Shield line 250d may extend from this connection point—e.g. to at least partially extends athwart the portion of pixel cell 200d which connects floating diffusion node 206 and another terminal which, of the terminals of reset transistor 203, is most directly coupled to floating diffusion node 206. In an embodiment, the other end of shield line 250d may remain unconnected—e.g. at least to any of the other circuit elements of pixel cell 200d shown in FIG. 2D. Similar to shield line 250c, shield line 250d may—e.g. as compared to shield lines 250a, 250b—provide a relatively small impact on floating diffusion potential, other than providing a reduction in Crst.

Figure 3A:
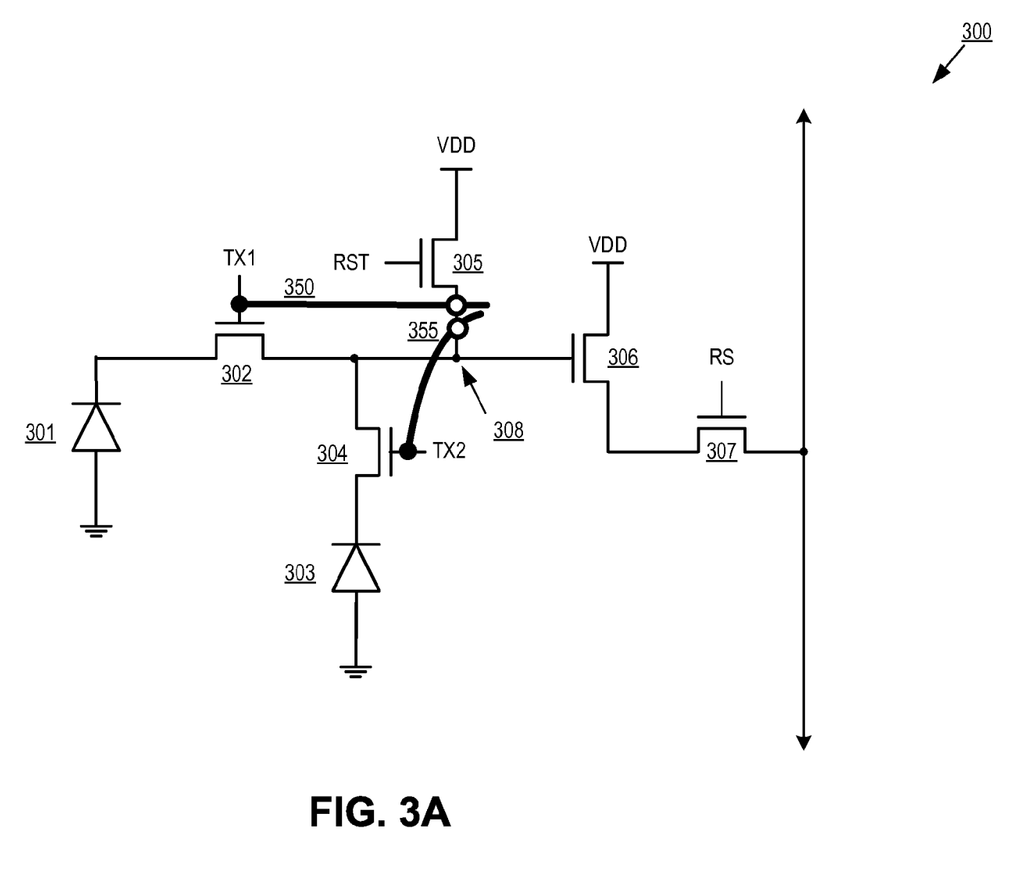
FIG. 3A is a circuit diagram illustrating pixel circuitry of a shared-reset pixel cell according to an embodiment.

FIG. 3A is a circuit diagram illustrating pixel circuitry for a shared-reset pixel cell 300, which provides reset shielding according to an embodiment. Shared-reset pixel cell 300 may replace two adjacent pixels cells—e.g. where such cells are in the same column of pixel array 405 of FIG. 4.

Shared-reset pixel cell 300 may include photodiodes 301, 303 and transfer transistors 302, 304 coupled respectively thereto. The pair of circuit elements including photodiode 301 and transfer transistor 302 and the pair of circuit elements including photodiode 303 and transfer transistor 304 may be considered as implementing functionality of two different pixel cells.

For example, the respective functionality of the pairs of circuit element corresponds to that of pixel cells sharing pixel circuitry—e.g. on a time multiplexed basis. Such shared pixel circuitry may, for example, include reset transistor 305, source-follower transistor 306, row select transistor 307 and floating diffusion node 308 of shared-reset pixel cell 300. In an embodiment, a single row select signal RS may be provided to row select transistor 307 for variously reading different data based on respective operations of photodiodes 301, 303. Separation of image captures may be achieved at least in part by transfer gates 302, 304 separating photodiodes 301, 303 respectively from floating diffusion node 308. A transfer signal TX1 may control transfer transistor 302 while a transfer signal TX2 may control transfer transistor 304.

To reduce reset capacitance Crst between reset transistor 305 and floating diffusion node 308, certain embodiments include in shared-reset pixel cell 300 shield line 350, a portion of which at least partially extends athwart—e.g. extends across and adjacent to—a connection between reset transistor 305 to floating diffusion node 308.

For example, floating diffusion node 308 may reside at or adjacent to, or include, a junction in shared-reset pixel cell 300 by which transfer transistor 302, reset transistor 305 and source-follower transistor 306 couple to one another. Accordingly, some or all of the respective terminals of transfer transistor 302, reset transistor 305 and source-follower transistor 306 may be offset from such a junction—e.g. where some coupling portion such as a trace line or other conductive or semi-conductive portion of shared-reset pixel cell 300 spans the offset to form a connection between reset transistor 305 and floating diffusion node 308.

Shield line 350 may extend over the portion of shared-reset pixel cell 300 which connects the junction forming at least part of floating diffusion node 308 and a terminal which, of the terminals in reset transistor 305, is most directly coupled to floating diffusion node 308. As shown in shared-reset pixel cell 300, shield line 350 may, for example couple at one end to a gate of transfer transistor 302. However, certain embodiments are not limited in this regard, and shield line 350 may be coupled to any of a variety of additional or alternative circuit elements, according to various embodiments. By way of illustration and not limitation, shield line 350 may have an alternate configuration within shared-reset pixel cell 300 which is similar to a corresponding configuration for one or shield lines 200b, 200c, 200d. In an embodiment, the other end of shield line 350 may remain unconnected—e.g. at least to any of the other circuit elements of shared-reset pixel cell 300 shown in FIG. 3A.

In certain embodiments, shared-reset pixel cell 300 additionally or alternatively includes shield line 355 to reduce—e.g. further reduce—reset capacitance Crst between reset transistor 305 and floating diffusion node 308. Shield line 355 may also extend athwart the connecting region between reset transistor 305 and floating diffusion node 308. By way of illustration and not limitation, shield line 355 may couple at one end to a gate of transfer transistor 304. However, certain embodiments are not limited in this regard, and shield line 355 may be coupled to any of a variety of additional or alternative circuit elements, according to various embodiments—e.g. in a configuration such as one of those shown for shield lines 200b, 200c, 200d. In an embodiment, the other end of shield line 355 remains unconnected—e.g. at least to any of the other circuit elements of shared-reset pixel cell 300 shown in FIG. 3A.

Figure 3B:
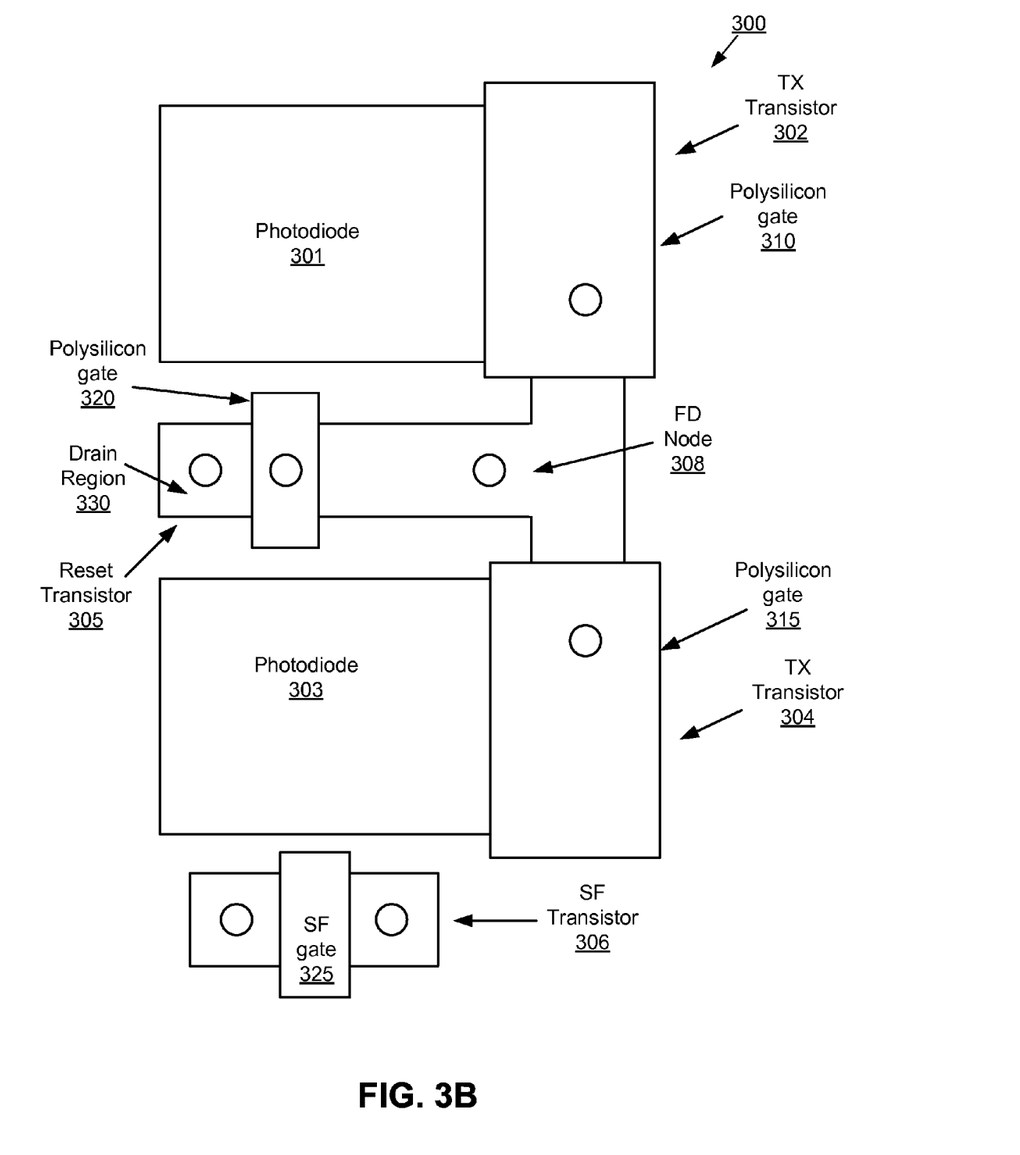
FIG. 3B is a layout diagram of a first fabrication stage of a shared-reset pixel cell according to an embodiment.

FIG. 3B is a layout diagram illustrating elements of shared-reset pixel cell 300 at some first stage of fabrication. As shown in FIG. 3B, shared-reset pixel cell 300 may include polysilicon gate 310 of transfer transistor 302 which adjoins both photodiode 301 and floating diffusion node 308. Moreover, shared-reset pixel cell 300 may include polysilicon gate 315 of transfer transistor 304 which adjoins both photodiode 303 and floating diffusion node 308. In an embodiment, polysilicon gate 320 of reset transistor 305 may separate from one another the floating diffusion node 308 and drain region 330 of reset transistor 305.

The geometry of some or all of pixel circuit elements shown in FIG. 3B—e.g. the size and configuration of such elements with respect to one another—may be determined according to conventional image sensing techniques, and are not limiting on certain embodiments. Moreover, the particular techniques for fabricating the structures shown in shown in FIG. 3B are not limiting on certain embodiments.

Figure 3C:
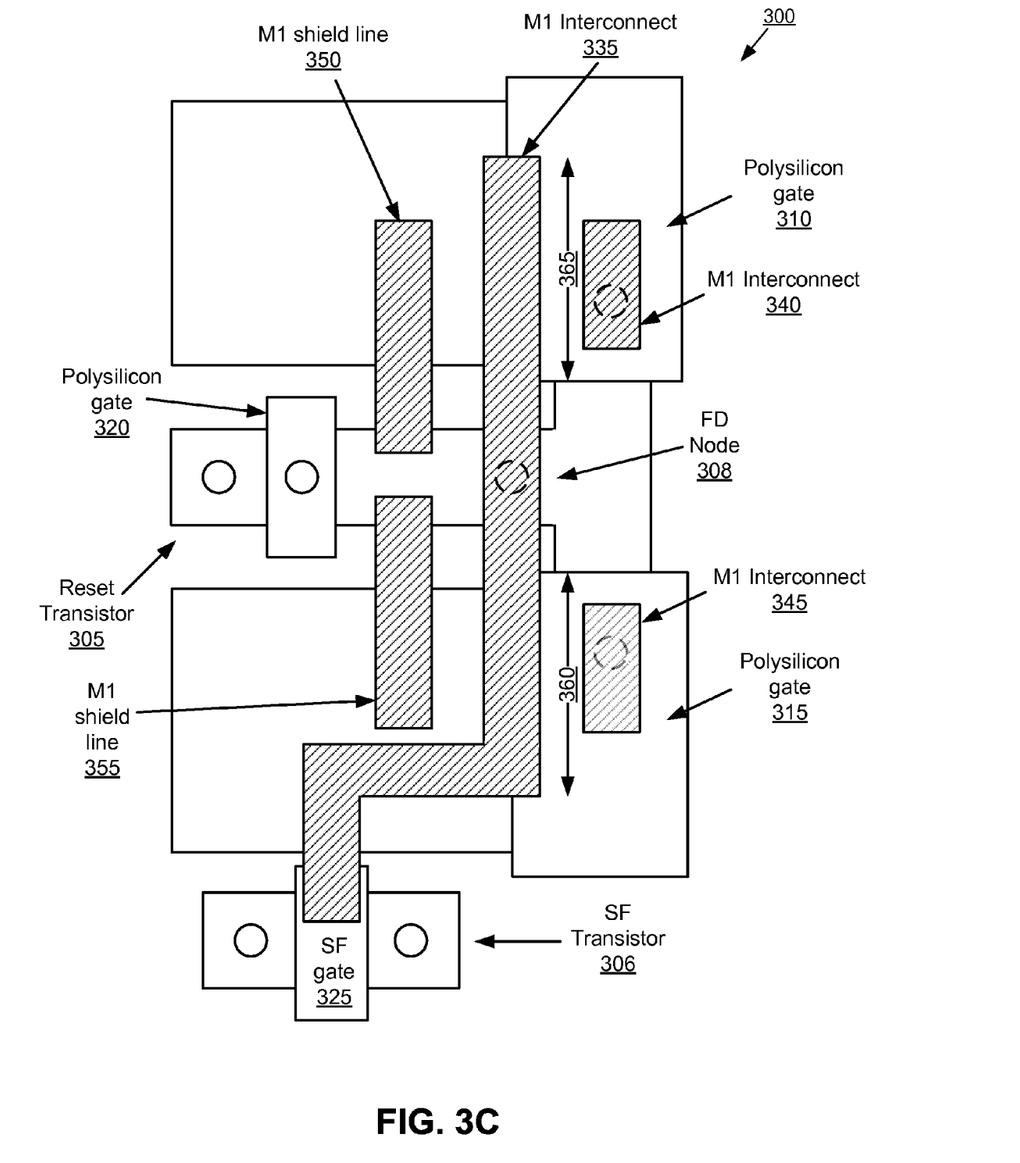
FIG. 3C is a layout diagram of a second fabrication stage of a shared-reset pixel cell according to an embodiment

FIG. 3C is a layout diagram illustrating elements of shared-reset pixel cell 300 at some second stage of fabrication—e.g. a fabrication stage which is subsequent to that shown in FIG. 3B. This second fabrication stage may include the deposition of a metal layer—referred to herein as a M1 layer—for providing reset shielding mechanisms of an illustrative embodiment. Discussion of a M1 layer, M2 layer etc. herein it merely illustrative. A reset shield line may be included to a pixel cell in any of a variety additional or alternative metal layers, according to different embodiments. Certain embodiments are not limited with respect to how the formation of a reset shield line might take place in a sequence of processes to fabricate shared-reset pixel cell 300.

As shown in FIG. 3C, shared-reset pixel cell 300 may include metal 1 (M1) interconnect 335 to connect polysilicon gate 325 of source follower transistor 306 to floating diffusion node 308. Alternatively or in addition, a contact, represented by a dotted circle, may connect polysilicon gate 310 to another metal 1 interconnect 340. Similarly, another contact may connect polysilicon gate 315 to metal 1 interconnect 345. To avoid capacitive mismatching of transfer gates 310, 315, length 365 of overlap of polysilicon gate 310 by M1 interconnect 335 should equal, or substantially equal, to length 360 of overlap of polysilicon gate 315 by M1 interconnect 335.

To reduce reset capacitance Crst between reset transistor 305 and floating diffusion node 308, M1 shield line 350 may be deposited to at least partially extend athwart the portion of shared-reset pixel cell 300 coupling floating diffusion node 308 to reset transistor 305. Additionally or alternatively, another M1 shield line 355 may be deposited to at least partially extend athwart the portion of shared-reset pixel cell 300 coupling floating diffusion node 308 to reset transistor 305. In subsequent fabrication, M1 shield line 350 may be coupled to polysilicon gate 310 and/or M1 shield line 355 may be coupled to polysilicon gate 315

Figure 3D:
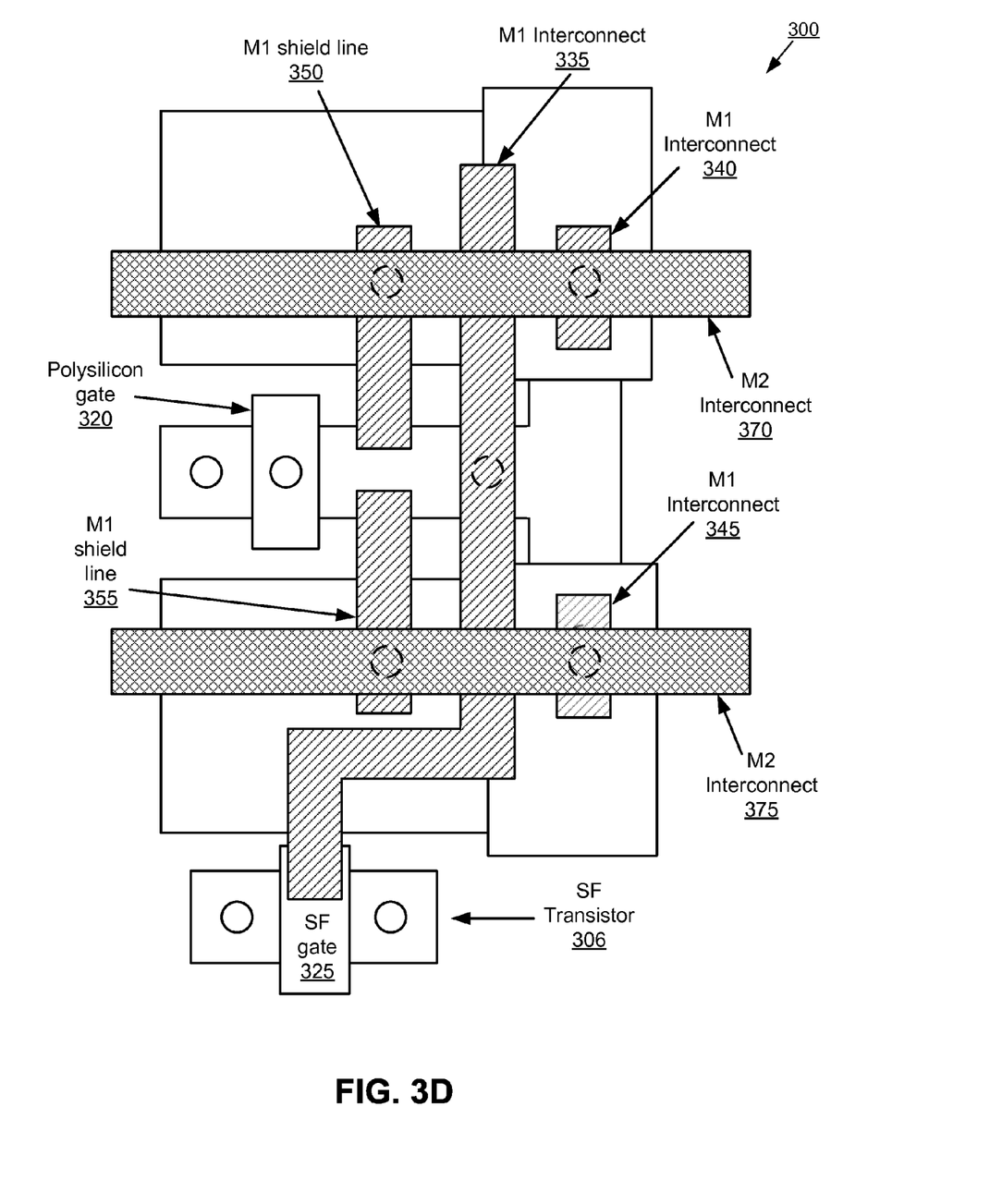
FIG. 3D is a layout diagram of a third fabrication stage of a shared-reset pixel cell according to an embodiment

FIG. 3D is a layout diagram illustrating elements of shared-reset pixel cell 300 at some third stage of fabrication—e.g. a fabrication stage which is subsequent to that shown in FIG. 3C. This third fabrication stage may include the deposition of another metal layer—for illustrative purposes, referred to herein as a metal 2 (M2) layer—to further connect reset shielding mechanisms of an illustrative embodiment.

In the illustrated embodiment of FIG. 3D, parasitic capacitance of reset transistor 305 to floating diffusion node 308 is reduced by an M1 shield line—e.g. a M1 interconnect which distributes transfer signal TX1 or transfer signal TX2. In other embodiments, a metal shield line may be coupled to distribute a bit line or power rail VDD. By way of illustration and not limitation, M2 interconnect 370 may connect M1 interconnect 340 and M1 shield line 350. Alternatively or in addition, M2 interconnect 375 may connect M1 interconnect 345 and M1 shield line 355.

The connection of M1 shield line 350 to M1 interconnect 340 by M2 interconnect 370 may shield polysilicon gate 320 of reset transistor 305 from floating diffusion node 308, and reduce the parasitic capacitance of reset transistor 305 to floating diffusion node 308. Similarly, the connection of M1 shield line 355 to M1 interconnect 375 by M2 interconnect 375 may additionally or alternatively provide a corresponding reduction of parasitic capacitance of reset transistor 305 to floating diffusion node 308. Such shielding may increase the overall capacitance and voltage potential of floating diffusion node 308.

Figure 4:
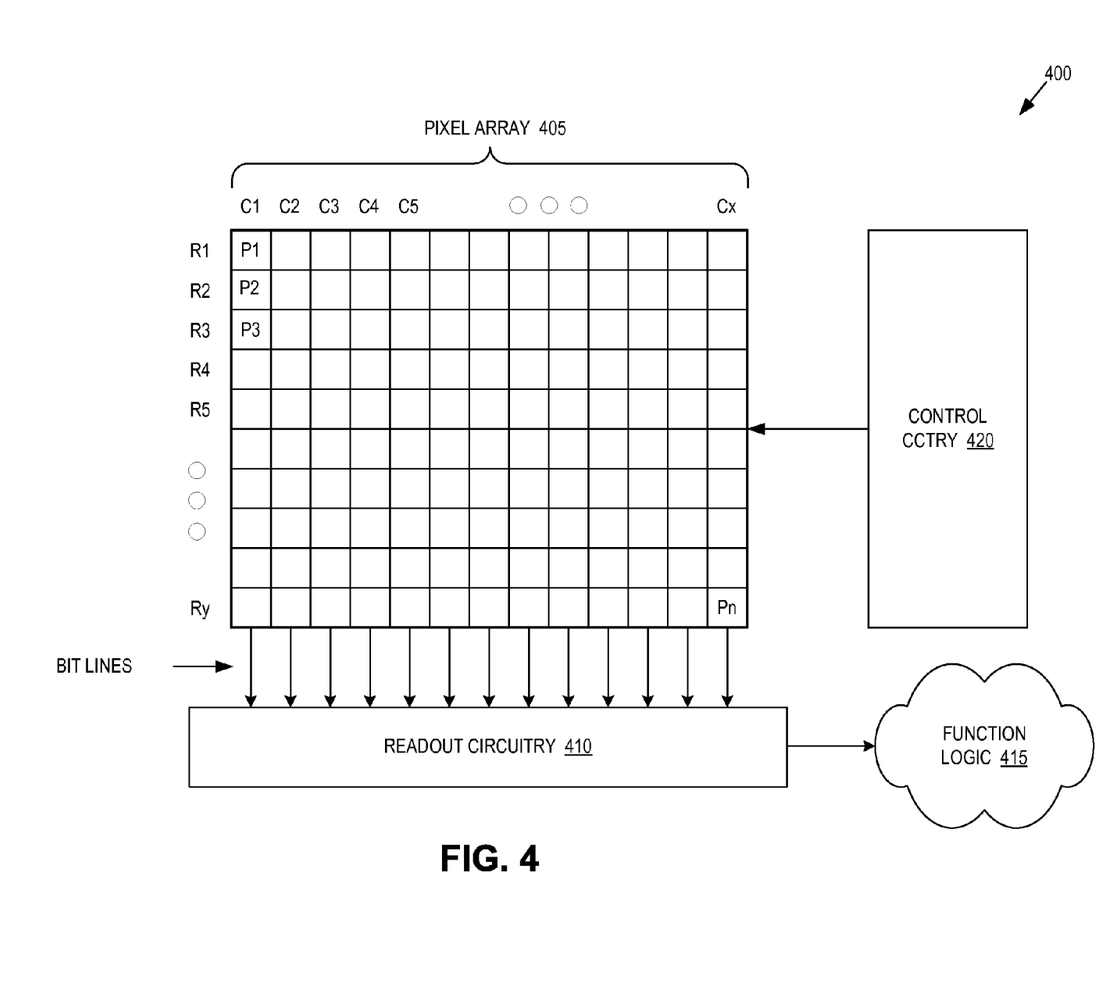
FIG. 4 is a block diagram illustrating an imaging system according to an embodiment.

FIG. 4 is a block diagram illustrating imaging system 400, in accordance with an embodiment of the invention. The illustrate embodiment of imaging system 400 includes pixel array 405, readout circuitry 410, function logic 415 and control circuitry 420.

Pixel array 405 is a two-dimensional array of imaging sensor cells or pixel cells (e.g., pixels P1, P2, . . . , Pn). In one embodiment, each pixel is a complementary metal-oxide-semiconductor ("CMOS") imaging pixel. Pixel array 405 may be implemented as a frontside illuminated image sensor or a backside illuminated image sensor. As illustrated, each pixel is arranged in a row (e.g., rows R1 to Ry) and a column (e.g. C1 to Cx) to acquire image data of a person, place or object, which can then be used to render an image of the person, place or object. Some or all of pixels P1, P2, . . . , Pn may variously provide for reset shielding according to the techniques discussed herein.

After each pixel has acquired its image data or image charge, the image data is readout by readout circuitry 410 and then transferred to function logic 415. Readout circuitry 410 may include amplification circuitry, analog-to-digital ("ADC") circuitry or otherwise. Function logic 415 may simply store the image data or even manipulate the image data by applying post-image effects (e.g., crop, rotate, remove red eye, adjust brightness, adjust contrast or otherwise). In one embodiment, readout circuitry 410 may readout a row of image data at a time along bit lines or may readout the image data using a variety of other techniques (not illustrated) such as a serial readout, column readout along readout row lines, or a full parallel of all pixels simultaneously. Control circuitry 420 is coupled to pixel array 405 and includes logic for controlling operational characteristics of pixel array 405.

Embodiments related to an image sensor comprised of pixel cells with a metal reset shield line are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A pixel array comprising:
    pixel cell including:
        a photodiode;
        a floating diffusion node to store charge generated by the photodiode;
        a reset transistor to reset a voltage of the floating diffusion node, wherein a coupling portion couples the floating diffusion node to a first terminal of the reset transistor; and
        a shield line extending athwart the coupling portion, the shield line to reduce parasitic capacitance of the reset transistor to the floating diffusion node;
    wherein the reset transistor includes a second terminal to couple the reset transistor to a supply voltage, wherein the shield line is directly coupled to the second terminal.

2. The pixel array of claim 1, the pixel cell further comprising:
    a transfer transistor coupled between the photodiode and the floating diffusion node, the transfer transistor to transfer charge from the photodiode to the floating diffusion node;
    wherein the shield line is coupled to a gate of the transfer transistor.

3. The pixel array of claim 1, the pixel cell further comprising:
    a second photodiode;
    a second transfer transistor coupled between the second photodiode and the floating diffusion node, the second transfer transistor to transfer charge from the second photodiode to the floating diffusion node; and
    a second shield line extending athwart the coupling portion, the second shield line to further reduce parasitic capacitance of the reset transistor to the floating diffusion node.

4. The pixel array of claim 3, wherein the second shield line is coupled to a gate of the transfer transistor.

5. The pixel array of claim 3, wherein the second shield line to reduce parasitic capacitance of the reset transistor to the floating diffusion node includes the shield line to carry a boost signal.

6. The pixel array of claim 3, the pixel cell further comprising a select transistor to couple the pixel cell to a readout signal line for reading an output of the pixel cell, wherein the second shield line is coupled to the readout signal line.

7. An image sensor comprising:
    pixel array including:
        pixel cell including:
            a photodiode;
            a floating diffusion node to store charge generated by the photodiode;
            a reset transistor to reset a voltage of the floating diffusion node, wherein a coupling portion couples the floating diffusion node to a first terminal of the reset transistor; and
            a shield line extending athwart the coupling portion, the shield line to reduce parasitic capacitance of the reset transistor to the floating diffusion node;
        wherein the reset transistor includes a second terminal to couple the reset transistor to a supply voltage, wherein the shield line is directly coupled to the second terminal; and
    readout circuitry to generate image data based on signals from the pixel array.

8. The image sensor of claim 7, the pixel cell further comprising:
    a transfer transistor coupled between the photodiode and the floating diffusion node, the transfer transistor to transfer charge from the photodiode to the floating diffusion node;
    wherein the shield line is coupled to a gate of the transfer transistor.

9. The image sensor of claim 7, the pixel cell further comprising:
    a second photodiode;
    a second transfer transistor coupled between the second photodiode and the floating diffusion node, the second transfer transistor to transfer charge from the second photodiode to the floating diffusion node; and
    a second shield line extending athwart the coupling portion, the second shield line to further reduce parasitic capacitance of the reset transistor to the floating diffusion node, wherein the shield line is coupled to a gate of the transfer transistor.

10. A pixel cell including:
    a photodiode;
    a floating diffusion node to store charge generated by the photodiode;
    a reset transistor to reset a voltage of the floating diffusion node, wherein a coupling portion couples the floating diffusion node to a first terminal of the reset transistor; and
    a shield line extending athwart the coupling portion, the shield line to reduce parasitic capacitance of the reset transistor to the floating diffusion node;
wherein the reset transistor includes a second terminal to couple the reset transistor to a supply voltage, wherein the shield line is directly coupled to the second terminal.

11. The pixel cell of claim 10, further comprising:
    a transfer transistor coupled between the photodiode and the floating diffusion node, the transfer transistor to transfer charge from the photodiode to the floating diffusion node;
    wherein the shield line is coupled to a gate of the transfer transistor.

* * * * *